United States Patent [19]

DuPuis

[11] Patent Number: 5,397,944
[45] Date of Patent: Mar. 14, 1995

[54] DENSE OFFSET CALIBRATION CIRCUITRY AND METHOD

[75] Inventor: Timothy J. DuPuis, Austin, Tex.

[73] Assignee: Crystal Semiconductor Corporation, Austin, Tex.

[21] Appl. No.: 45,855

[22] Filed: Apr. 9, 1993

[51] Int. Cl.$^6$ .............................................. H03F 1/26
[52] U.S. Cl. .................... 327/307; 327/362; 327/537
[58] Field of Search .................... 307/247.1, 291, 269, 307/272.2, 491, 494, 482, 296.8, 315

[56] References Cited

U.S. PATENT DOCUMENTS

| | | | |
|---|---|---|---|
| 4,140,874 | 2/1979 | Thomas | 307/231 |
| 4,224,533 | 9/1980 | Lai | 307/247.1 |
| 4,553,046 | 11/1985 | Alzati et al. | 307/291 |
| 4,553,052 | 11/1985 | Takahashi | 307/291 |
| 4,633,098 | 12/1986 | Mahmud | 307/291 |
| 4,902,921 | 2/1990 | Hiramoto et al. | 307/315 |

Primary Examiner—John S. Heyman
Assistant Examiner—Terry L. Englund
Attorney, Agent, or Firm—Robert D. Lott

[57] ABSTRACT

An audio mixer circuit on an integrated circuit chip performs a calibration operation on power up which calibrates out most of the offset voltages of the operational amplifiers used in the mixer. The calibration logic includes a shared calibrate circuit which provides timing signals to each operational amplifier and its associated calibration circuitry. The calibration operation is performed by digitally controlling and changing the bias current into each of the operational amplifiers until the offset voltage is compensated. A class A flip-flop circuit is used in the digital counter of the calibration circuitry to drive a current digital-to-analog converter.

7 Claims, 4 Drawing Sheets

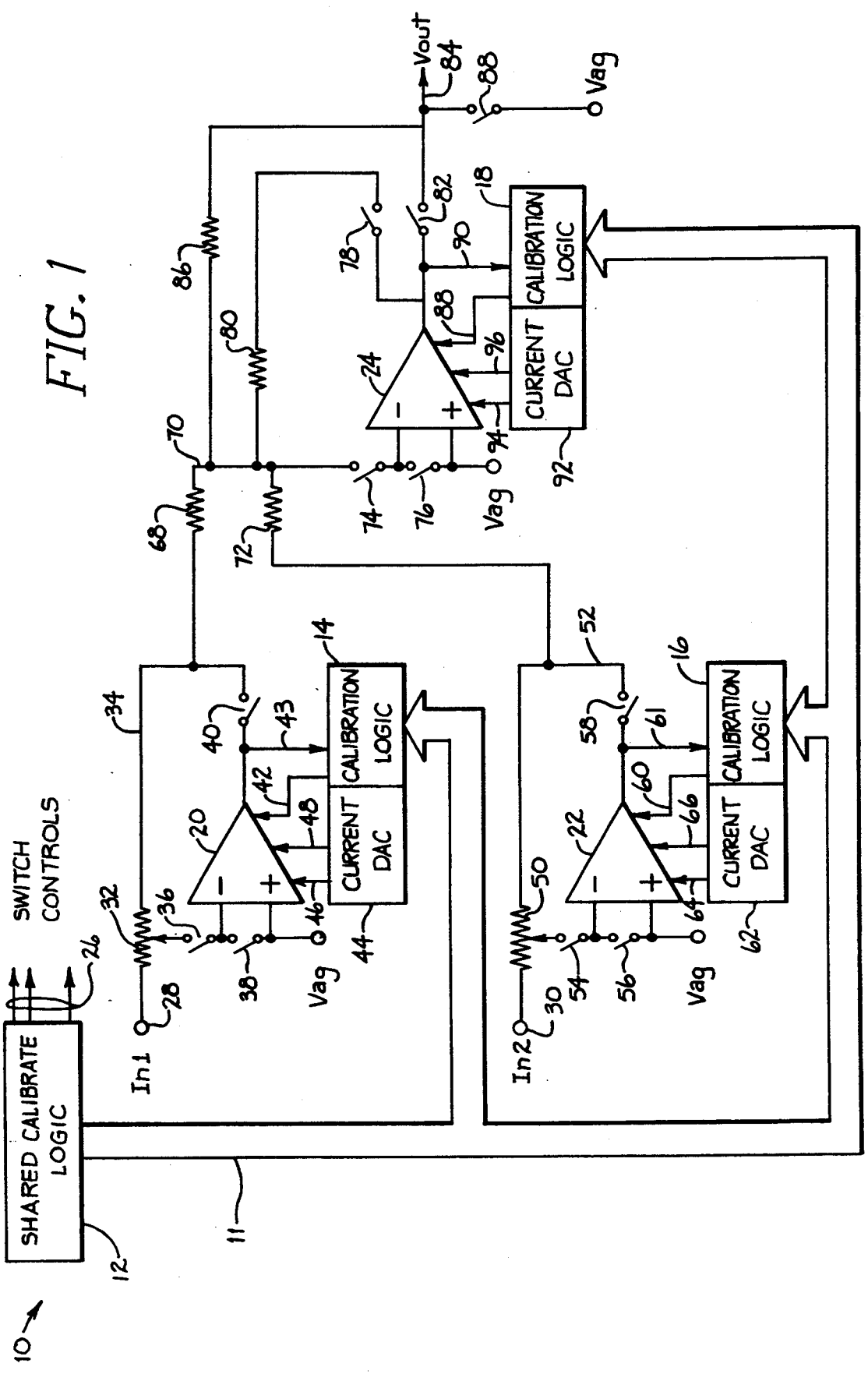

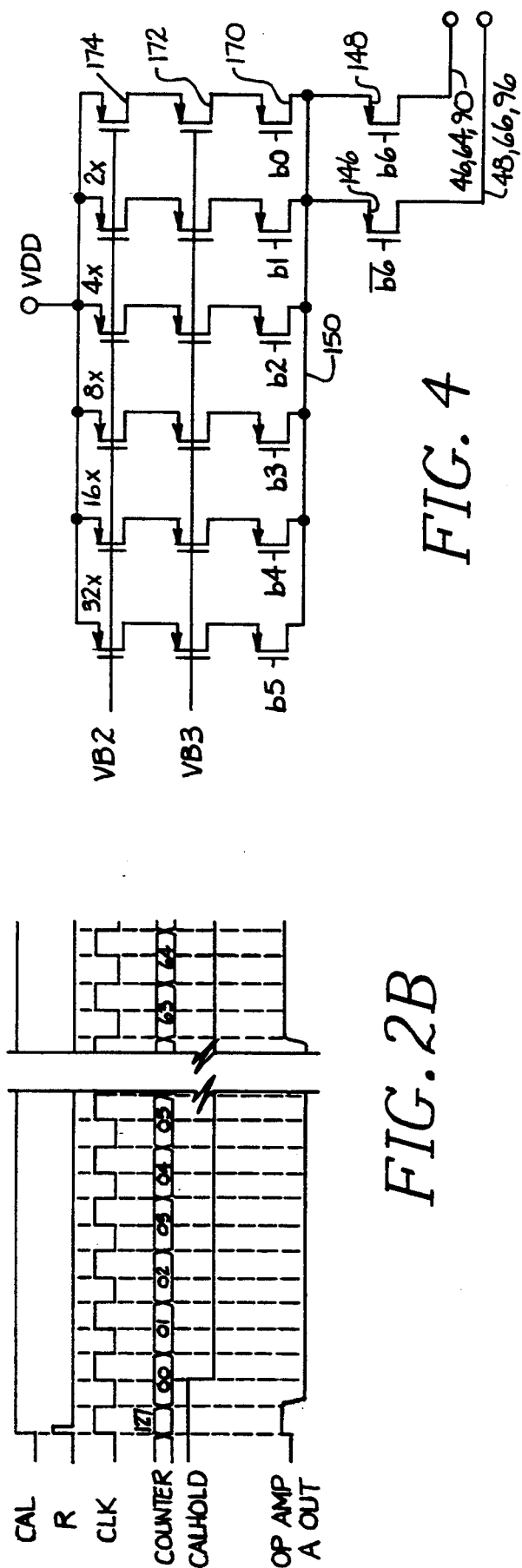
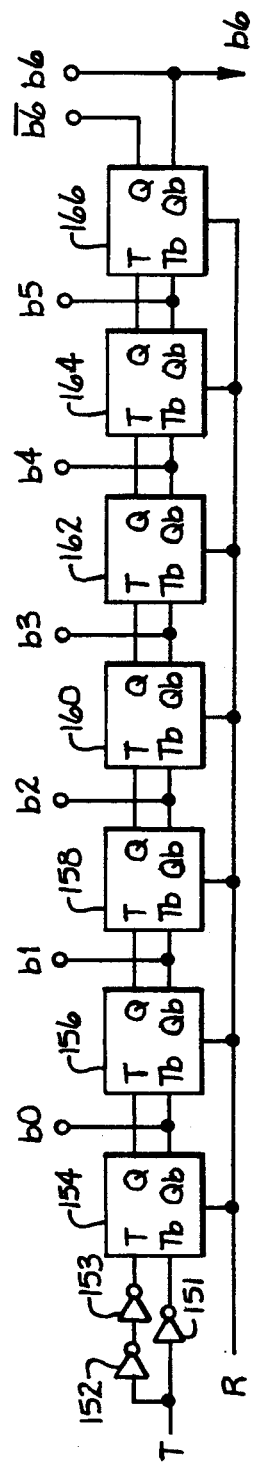
FIG. 2B
FIG. 4
FIG. 3

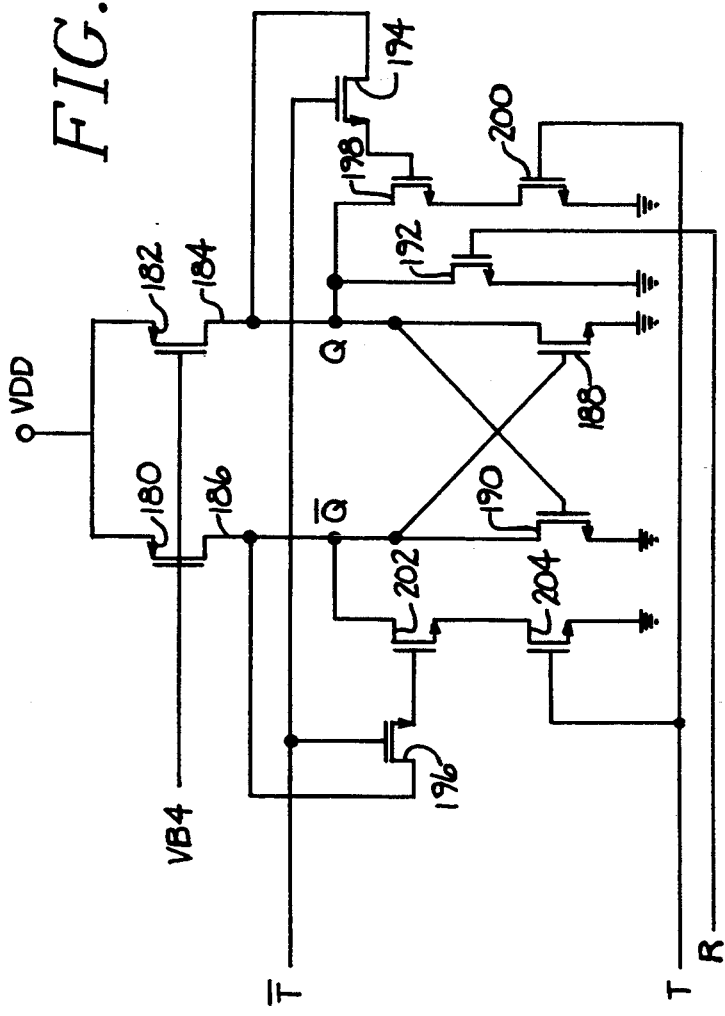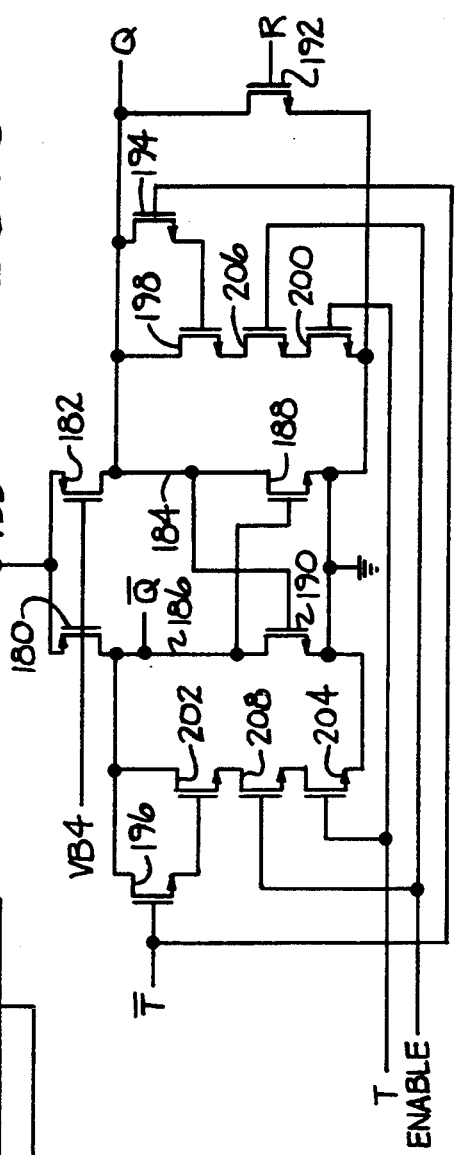

DENSE OFFSET CALIBRATION CIRCUITRY AND METHOD

TECHNICAL FIELD

The present invention relates to the offset calibration of operational amplifiers, and more particularly, to high density offset calibration circuitry.

BACKGROUND OF THE INVENTION

In CMOS audio mixer circuits, in which many inputs are mixed and amplified using operational amplifiers, the voltage offset of these operational amplifiers, especially when the amplifiers are cascaded in stages, can cause clicks and pops in the audio output when inputs are switched in or switched out, or when the output is muted. Typical small CMOS operational amplifier offsets are on the order of 10 mV which can easily result in 20-40 mV changes at the output when the gain/attenuation or mute is changed and is a disturbing audible click for someone listening.

One prior art method of solving this problem is to design operational amplifiers with very low offset voltages, on the order of 200-500 µV. This results in output noise signals or clicks of less than 2 mV which are inaudible. Methods used to reduce offsets in CMOS operational amplifiers are (1) chopping the input to the amplifiers and thereby chopping the offset and filtering it out, and (2) digital offset calibration at power up. The chopping schemes have the drawback that they can alias high frequency signals coming in. Prior offset calibrations schemes have the drawback that typical implementations take a lot of area due to the large amount of associated calibration logic for each amplifier. On a multi-function integrated circuit chip in which chip area is at a premium, it can be appreciated that a offset calibration circuit and method which is highly dense and, thereby, uses relatively small amounts of chip area is highly desirable.

SUMMARY OF THE INVENTION

It is therefore an object of the present invention to provide offset calibration circuitry and method which is highly dense permitting a relatively large number of operational amplifiers to be calibrated on a single integrated circuit chip.

Shown in an illustrated embodiment of the invention is a method for compensating for the offset voltage of a plurality of operational amplifiers which includes a step of first providing a calibrate signal from a shared calibrate circuit to couple both inputs of the operational amplifiers to a reference voltage. Next control signals are provided from the shared calibrate logic to a plurality of calibrate circuits, each coupled to one of the operational amplifiers in order to inject a bias current into at least one node of each of the operational amplifiers such that the offset voltage of the amplifier is changed as a result of the injected current. The injected current is changed in a stepwise manner until the outputs of each of the operational amplifiers change.

Also shown in an illustrated embodiment of the invention is a toggle flip-flop having first and second current control elements, the first current control element being coupled between a first reference voltage and a true data node, and the second current control element coupled between the first reference voltage and a complementary data node. The flip-flop also includes first and second data transistors, the first data transistor coupled between the true data node and a second reference voltage, and the second data transistor coupled between the complementary data node and the second reference voltage. The flip-flop further includes first and second charge transfer transistors, the first charge transfer transistor having its drain coupled to the true data node, and its gate coupled to a Tb input signal, the second charge transfer transistor having its drain coupled to the complementary data node, and its gate coupled to the Tb input signal. The flip-flop additionally includes first and second coupling transistors, the first coupling transistor having its drain coupled to the true data node, and its gate coupled to the source of the first charge transfer transistor, the second coupling transistor having its drain coupled to the complementary data node, and its gate coupled to the source of the second charge transfer transistor. The flip-flop includes first and second enabling transistors, the first enabling transistor having its drain coupled to the source of the first coupling transistor, its gate coupled to a T input signal, and its source coupled to the second reference voltage, the second enabling transistor having its drain coupled to the source of the second coupling transistor, and its gate coupled to the T input signal, and its source coupled to the second reference voltage.

BRIEF DESCRIPTION OF THE DRAWINGS

The aforementioned and other features, characteristics, advantages, and the invention in general, will be better understood from the following, more detailed description taken in conjunction with the accompanying drawings in which:

FIG. 1 is a block diagram of a mixing circuit which includes a dense offset calibration circuit according to the present invention;

FIG. 2B is a timing diagram of the signals used in FIG. 2A;

FIG. 3 is a block diagram of the 7-bit counter shown in FIG. 2A;

FIG. 4 is a schematic diagram of the current digital-to-analog converter (DAC) shown in FIG. 2A;

FIG. 5 is a schematic diagram of a first embodiment of the toggle flip-flop cell shown in FIG. 3; and FIG. 6 is a schematic diagram of the preferred embodiment of the T flip-flop cell shown in FIG. 3.

Figure 2A:
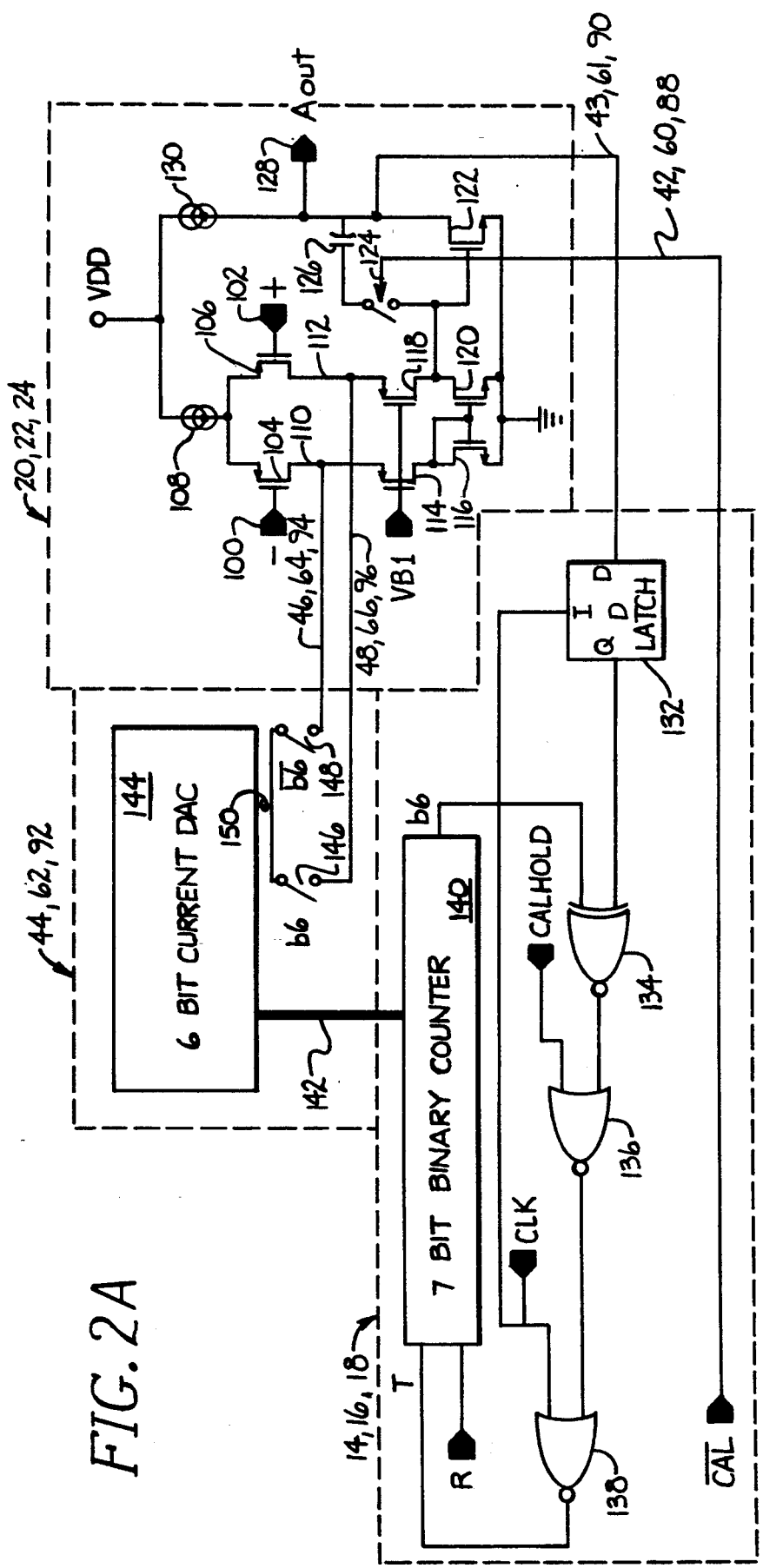
FIG. 2A is a partial block diagram/partial schematic drawing of an individual operational amplifier and calibration circuit according to the present invention.

It will be appreciated that for purposes of clarity and where deemed appropriate reference numerals have been repeated in the figures to indicate corresponding features.

DESCRIPTION OF THE PREFERRED EMBODIMENT

The calibration method of the present invention provides offset voltage calibration of a series of operational amplifiers. The method is very area efficient and includes a shared calibrate logic which is common to all the amplifiers. Each of the amplifiers has associated with it calibration logic which includes a counter circuit to provide outputs to a digital-to-analog converter (DAC) which, in turn, provides varying amounts of bias current to a node inside each of the amplifiers.

In operation at power up each of the amplifiers is calibrated by using an auto-calibration scheme of the present invention. The shared calibrate logic provides clock pulses to each of the calibration logic circuits which in turn select varying amounts of bias current to each of the amplifiers. When the output of an individual amplifier changes state, indicating that the offset voltage of the amplifier has been compensated, the individual calibration logic circuits stop their count and the output of the current DAC is held constant from that point on.

Each of the counter cells is fabricated using CMOS logic, but the counters, in order to realize a very area efficient calibration scheme, are class A cells which draw current continuously. The class A cells of the present invention provide about a 40% reduction in the chip area required for conventional CMOS counter circuits.

Turning now to the drawings, FIG. 1 is a block diagram of a mixing circuit 10 which includes a dense offset calibration circuit according to the present invention. Mixing circuit 10 includes a shared calibrate logic block 12 which provides timing signals through a bus 11 to calibration logic circuits 14, 16 and 18, each of which is associated with an individual operational amplifier 20, 22 and 24 respectively. The shared calibrate logic 12 also provides switch control signals on lines 26 which are used to control the switches associated with the operational amplifiers 20, 22, and 24 as will be described in more detail below.

Mixing circuit 10 shown in FIG. 1 has two audio input inputs, a first input, In1, on terminal 28 and a second input, In2, on terminal 30. The input on terminal 28 is connected to one end of a tapped resistor 32. The other end of the tapped resistor 32 is connected to a node 34. The tap on resistor 32 is coupled through a switch 36 to the inverting input of the operational amplifier 20. The inverting input of operational amplifier 20 is coupled through another switch, 38, to the noninverting input of the amplifier 20 which is also connected to Vag, an analog ground reference voltage, which, in the preferred embodiment is 2.1 volts above chip ground. The output of the operational amplifier 20 is connected to one end of a switch 40, the other end of which is connected to node 34. The calibration logic circuit 14 provides an output on line 42 directly to the operational amplifier 20 and receives the output of the operational amplifier 20 on line 43. The calibration logic 14 also provides a signal to a current digital-to-analog converter (DAC) 44 which provides current on one of two lines, 46 or 48, to the operational amplifier 20 in a manner described below.

In a similar manner, the second input, In2, at terminal 30 is connected to one input of a tapped resistor 50, the other end of the tapped resistor 50 being connected to a node 52. The tap on the resistor 50 is coupled through a switch 54 to the inverting input of the operational amplifier 22. The inverting input of the operational amplifier 22 is coupled through another switch 56 to the noninverting input of the operational amplifier 22 which is also connected to Vag. The output of the operational amplifier 22 is coupled through switch 58 to node 52. The calibration logic circuit 16 provides an output on line 60 directly to the operational amplifier 22 and receives the output of the operational amplifier 22 on line 61. The calibration logic 16 also controls a current DAC 62 which provides current to the operational amplifier 22 on one of two lines, 64 or 66.

The output of the operational amplifier 20 at node 34 is coupled through a resistor 68 to a summing node 70. Similarly the output of operational amplifier 22 at node 52 is coupled through another resistor 72 to summing node 70. The summing node 70 is coupled to the inverting input of the operational amplifier 24 through a switch 74. The inverting input of the operational amplifier 24 is coupled through a switch 76 to the non-inverting input of the operational amplifier 24 which is also connected to Vag. The output of the operational amplifier 24 is coupled through a first switch 78 which in turn is coupled through a first feedback resistor 80 to the summing node 70. The output of the operational amplifier 24 is also coupled through another switch 82 to the Vout terminal 84 and also through a second feedback resistor 86 to the summing node 70. The output terminal 84 is coupled to Vag through a switch 88. The calibration logic circuit 18 provides an output on line 88 directly to the operational amplifier 24 and receives the output of the operational amplifier 24 on line 90. The calibration logic 18 also controls a current DAC 92 which provides current to the operational amplifier 24 on one of two lines, 94 or 96.

In normal operation the switches 36, 40, 54, 58, 74, and 82 are closed and the other switches in FIG. 1 are open. The operation of the mixer 10 in normal use is well known in the art. That is, the input signal at In1 is amplified by an amount determined by the position of the tap on the resistor 32 to provide an output signal at node 34, and the input signal at In2 is amplified by an amount determined by the position of the tap on the resistor 50 to provide an output signal on node 52. The two output signals are summed at the summing node 70 and amplified by the operational amplifier 24 to provide Vout at output terminal 84. Shortly after power up the operational amplifiers 20, 22, and 24 are calibrated in a manner to be described below.

FIG. 2A is a partial block diagram, partial schematic diagram of each of the operational amplifiers 20, 22, and 24, of each of the calibration logic circuits 14, 16, and 18, and of each of the current DACs 44, 62, and 92. Each of the operational amplifiers 20, 22, and 24 receives its inverting input at a node 100, and it noninverting input at a node 102. The inverting input at node 100 is connected to the gate of a first p-channel transistor 104 which has its source connected to the source of a second p-channel transistor 106, which has its gate, in turn, connected to the noninverting input at node 102. The sources of transistors 104 and 106 are coupled to VDD through a current source 108 which, in the preferred embodiment, provides about 80 $\mu$a of current through transistors 104 and 106. The drain of transistor 104 is connected to a first current bias node 110, and the drain of transistor 106 is connected to a second current bias node 112. As shown in FIG. 2A node 110 is connected to lines 46, 64, or 94 and node 112 is connected to lines 48, 66, or 96. Node 110 is coupled through a p-channel bias transistor 114 to the drain of an n-channel transistor 116. Similarly node 112 is connected through another p-channel bias transistor 118 to the drain of an n-channel transistor 120. The gates of the p-channel bias transistors 114 and 118 are driven by a bias voltage VB1. The drain and gate of transistor 116 are connected together and the sources of transistors 116 and 120 are connected to ground. The drain of transistor 120 forms the output of the first stage of the operational amplifiers 20, 22, and 24, and is connected to the gate of an output n-channel transistor 122. The drain of transistor 120 is also coupled through a switch 124 to a first terminal of a compensating capacitor 126. The second terminal of the compensating capacitor 126 is connected to the drain of transistor 122 and to an output terminal of the operational amplifier, Aout, shown as element 128. The source of transistor 122 is grounded, and the output terminal 128 is coupled to VDD through another current source 130.

The calibration logic circuits 14, 16, and 18 receive the output of the operational amplifiers 20, 22, and 24 on lines 43, 61, and 90, respectively, which are connected to the D input of a D latch 132. The output of the D latch 132 is connected to one input of an exclusive NOR gate 134, the output of which is connected to one input of a dual input NOR gate 136, the output of which is connected to one input of another dual input NOR gate 138, the output of which forms the T input of a 7 bit binary counter circuit 140. The 7 bits from the 7 bit binary counter circuit 140 are passed on a bus 142 to a 6 bit current DAC 144 in the current DAC circuits 44, 62, and 92. The seventh bit, the b6 bit, is used to control one of two switches, 146 and 148, in the current DACs 44, 62, and 92. The b6 output of the 7 bit binary counter circuit 140, which is the most significant bit of the counter, is coupled into the second input of the exclusive NOR gate 134. A signal label CALHOLD in FIG. 2A is received from the shared calibrate logic 12 on bus 11, and is connected to the second input of the NOR gate 136. A clock signal, CLK, is also received from the shared calibrate logic 12 on bus 11 and forms the second input of the NOR gate 138, and also the latch input, $\overline{L}$, of the D latch 132. A reset input, R, is received from the shared calibrate logic 12 on bus 11 and is used to reset the 7 bit binary counter circuit 140. Finally, a signal labelled $\overline{CAL}$ is received from the calibrate logic 12 on bus 11 and is routed to control switch 124 in the operational amplifiers 20, 22, and 24.

With respect to the current DAC circuits 44, 62, and 92, the output from the 6 bit current DAC 144 at node 150 is coupled either to the node 110 of the operational amplifiers 20, 22, and 24, when switch 148 is closed, or to node 112 when switch 146 is closed. Switch 148 is controlled by bit b6 and switch 146 is controlled by bit $\overline{b6}$.

The operation of the calibration circuitry shown in FIG. 2A will now be described with reference also to the timing diagram shown in FIG. 2B. When power is first applied to the mixer circuit 10, the compensating capacitors 126 of the operational amplifiers 20, 22, and 24 are first charged to their normal operating voltage. This is accomplished by opening switch 82 in FIG. 1 and closing switch 78 to thereby provide a feedback path for the operational amplifier 24 without having to drive whatever circuitry is loading the Vout output pin 84. Also at this time switch 88 is closed in order to ground the output signal Vout of the mixer 10. At this time switches 36, 54, 74, 40, and 58 are also closed, while switches 38, 56, and 76 are open.

After a time sufficient for the compensating capacitors 126 to be charged to their normal operating voltages, the mixer circuit 10 begins its calibration procedure. When the signal CAL in FIG. 2B goes high (logic 1 level), then the switches 36, 54, 74, 40, 58, 78, and 82 are open while the switches 38, 56, and 76 are closed. This causes each of the operational amplifiers 20, 22, and 24 to have their inputs grounded and their outputs running in an open loop manner and therefore acting as comparators rather than feedback amplifiers. In order for the operational amplifiers to operate more quickly, the switches 124 are also opened by signal $\overline{CAL}$ in FIG. 2A, which is the logical inverse of the signal CAL in FIG. 2B. At approximately the same time CAL goes high, reset signal R is pulsed to reset the 7 bit binary counter circuit 140. In addition the signal CALHOLD is high before the calibration operation and remains high until the second clock pulse as shown in FIG. 2B, at which time it goes low (logic 0 level) and the calibration procedure actually begins. When the 7 bit binary counter circuit 140 is reset, the signals on bus 142 to the 6 bit current DAC cause the maximum current to be generated in the current DAC 144 and transferred through switch 146 to node 112. The maximum current from the 6 bit current DAC 144 in the preferred embodiment is approximately 8 μa which, for a normal operational amplifier 20, 22, or 24, is enough to force the output of the operational amplifier at node 128 low. Thus the CALHOLD stays high long enough for the 7 bit binary counter circuit 140 to reset, for the 6 bit current DAC 144 to settle at its maximum current, and for the output of the operational amplifiers 20, 22, and 24 to switch to a low logic level. The clock signal CLK provides pulses to the T input of the 7 bit binary counter circuit 140 which, as will be described below, operates as ripple counter, and begins counting from the all 0's position of 0000000 to the all 1's position of 1111111. As the counter counts from the all 0's position up to the 0111111 count, the current out of the 6 bit current DAC 144 decreases in steps of approximately 125 na per step, and the current injected into the node 112 therefore decreases accordingly. When the 7 bit binary counter circuit 140 reaches the state of 1000000, the switch 146 is opened and switch 148 is closed and the current from the 6 bit current DAC 144 again switches to maximum current, which this time is passed to node 110 in the operational amplifiers 20, 22, and 24. This maximum current will flip the output of the operational amplifiers at node 128 to go high. The sixth bit output from the 7 bit binary counter circuit 140 is then used to compensate for the change in the output from the operational amplifier node 128 through the exclusive NOR gate 134. After the 1000000 state the output from the 6 bit current DAC 144 will begin to decrease in steps to a minimum when the 1111111 count is reached.

Since the 7 bit binary counter circuit 140 is a ripple counter, and the 6 bit current DAC 144 takes a finite time to set up, and the operational amplifiers 20, 22, and 24 take a finite time to respond to the bias current, the D latch 132 is used to latch at the Q output the D input from the operational amplifier on the falling edge of the clock signal, while the 7 bit binary counter circuit 140 and the 6 bit current DAC 144 and operational amplifiers 20, 22, and 24 change states in response to the falling edge of the clock signal shown in 2B.

At some point in the calibration, the current injected into node 110 or node 112 will cause the output 128 of the operational amplifier to change state. At this point the operational amplifiers offset voltage has been compensated for. That is the current injected into the node 110 or 112 which is within 125 na of the current actually needed to absolutely zero the offset voltage of the operational amplifiers 20, 22, and 24. In actual practice it has been found that the offset voltages of the operational amplifiers 20, 22, and 24 calibrated in this manner have an offset voltage of less than 0.3 mV. Experimentation has also shown that if the offset voltage is less than about 0.5 mV, an audible click or pop will not be produced in the output of the mixer when input signals are switched on or off or the output is muted.

When the output of the operational amplifier changes state other than when the output of the 7 bit binary counter circuit 140 is in the all 0's state or the 0111111 state, the output of the exclusive NOR gate 134 changes to a logic 0 level, which causes the output of the NOR gate 136 to go to a logic 1 level, which in turn forces the output of the NOR gate 138 to be constantly low thereby stopping any additional changes in the 7 bit binary counter circuit 140. In this manner the operational amplifiers 20, 22, and 24 are simultaneously calibrated until each reaches its compensating voltage at which time its individual 7 bit binary counter circuits 140 stop counting and the current from the 6 bit current DAC 144 is held constant. The shared calibrate logic 12 provides all 128 clock pulses at which time the CAL signal again goes low and the CALHOLD signal goes high. The CAL signal going low causes the compensating capacitors 126 to be connected back into the output stages of the operational amplifiers 20, 22, and 24, and also opens switches 38, 56, 76, and 88, and closes switches 36, 40, 54, 58, 74, and 82, while switch 78 remains open.

FIG. 3 is a block diagram of the 7 bit binary counter circuit 140 shown in FIG. 2A. As shown in FIG. 3 the T input signal is inverted by an inverter 151 to form $\overline{T}$, and inverted twice by two inverters in series, 152 and 153, to form the T input to a first T flip-flop 154. The inverter 152 is of conventional design, while inverters 151 and 153 provide fast fall times, but relatively slow rise times, which is advantageous for reasons described below. The T input is also connected to the T input of a first T flip-flop 154. The $\overline{T}$ output of the inverter 151 is connected to the $\overline{T}$ or Tb input of the T flip-flop 154. The $\overline{Q}$ or Qb output of the T flip-flop 154 forms the b0 output of the 7 bit binary counter circuit 140. The Q output of the T flip-flop 154 forms the T input to the second T flip-flop 156, and the $\overline{Q}$ or Qb output of the T flip-flop 154 provides the Tb input of the T flip-flop 156. The Qb output of the T flip-flop 156 forms the b1 output. In a similar manner T flip-flops 158, 160, 162, 164, and 166 are cascaded to provide the output signals b2, b3, b4, b5, and b6 respectively. The Qb output of T flip-flop 166 forms the b6 signal, and the Q output forms the $\overline{b6}$ signal. The reset signal R is connected to the R inputs of the T flip-flops 154–166. The T flip-flops 154–166 will be described in more detail below with reference to FIGS. 5 and 6.

FIG. 4 is a schematic diagram of the 6 bit current DAC 144 shown in FIG. 2A. As shown in FIG. 4 the circuit diagram of the 6 bit current DAC is of conventional design. As shown in FIG. 4, each of the output signals b0–b5 is connected to the gate of one of three series p-channel transistors. For example the signal b0 is connected to the gate of transistor 170, the source of which is connected to the drain of a bias p-channel transistor 172, the source of which is connected to the drain of another bias p-channel transistor 174, the source of which is connected to VDD. In a similar manner signals b1–b5 are connected to the gates of p-channel transistors whose sources are connected through two bias transistors to VDD. The drains of the transistors driven by b0–b5 form the node 150. The transistors 170, 172 and 174 are, in the preferred embodiment, single transistors, while all of the three series transistors which form the b1 current path are actually two sets of three transistors connected in parallel with b1 driving the gates of two transistors to provide twice the current as the b0 signal. Similarly b2 is actually driving the gates of 4 transistors, b3 is driving the gates of 8 transistors, b4 is driving the gates of 16 transistors, and b5 is driving the gates of 32 transistors. Thus there are 64 bias transistors like and including transistor 174, 64 bias transistors like and including transistor 172, and 64 transistors like and including transistor 170 driven by the signals b0–b5 in the preferred embodiment. Since the transistors driven by signals b0–b5 are all p-channel transistors, when the output of the 7 bit binary counter circuit 140 is reset such that the outputs are all 0, then each of the transistors in the 6 bit current DAC being driven by b0–b5 will be conductive and provide the maximum current through node 150.

FIG. 5 is a schematic diagram of the T flip-flops 154–166 of FIG. 3. As shown in FIG. 5 first and second bias transistors or current limiting devices 180 and 182 have their sources connected to VDD. The drain of transistor 182 is connected to a true data node 184, and the drain of transistor 180 is connected to a complementary data node 186. The true data node 184 also forms the Q output of the T flip-flop, and the complementary data node 186 also forms the $\overline{Q}$ output of the T flip-flop. The true data node 184 is coupled to ground through an n-channel transistor 188, the gate of which is connected to the complementary data node 186. Similarly the complementary data node 186 is coupled to ground through an n-channel transistor 190, the gate of which is connected to the true data node 184. The reset signal R of the T flip-flops 154–166 is connected to the gate of an n-channel transistor 192, the source of which is grounded, and the drain of which is connected to the true data node 184. Thus the bias transistors 180 and 182 and the cross coupled data transistors 188 and 190 form a bistable circuit. When the reset signal, R, goes high, the Q output at true data node 184 is forced to ground which in turn causes the $\overline{Q}$ output at the complementary data node 186 to the logic 1 state. Thus the b0–b5 outputs are at the all 1's state when the T flip-flops 154–166 are reset, and switch to the all 0's state on the first clock pulse after reset.

The Tb signal is connected to the gates of two n-channel transistors 194 and 196. The drain of transistor 194 is connected to the true data node 184, and the drain of the transistor 196 is connected to the complementary data node 186. The source of transistor 194 is connected to the gate of an n-channel transistor 198, the drain of which is connected to the true data node 184, the source of which is connected to the drain of another n-channel transistor 200, the gate of which is connected to the T input and the source of which is grounded. Similarly the source of transistor 196 is connected to the gate of an n-channel transistor 202, the drain of which is connected to the complementary data node 186, the source of which is connected to the drain of another n-channel transistor 204, the gate of which is connected to the T input and the source of which is grounded.

In operation after the T flip-flop is reset with Q output low and $\overline{Q}$ high, the T input should be low and the Tb input high. Each time the T input is brought high and the Tb input is pulled low, the output of the T flip-flop will be toggled. When the Tb input is high, the gate of transistor 202 or 198 will be high depending on whether the true data node 184 is high or the complementary data node 186 is high. When the Tb signal is brought low quickly, the charge on the gates of the transistors 202 and 198 is isolated, and the gate to source capacitance of the transistors 198 and 202 will retain the charge on the gate provided that the Tb signal is brought low rapidly, and the T signal is brought high either slowly or delayed until the Tb signal is brought low. When the T signal becomes high, transistors 200 and 204 become enabled thereby grounding the sources of transistors 202 and 198. The transistor 198 or 202 which has a high voltage trapped on its gate will become conductive thereby drawing the true data node 184 to ground if the voltage on the gate of transistor 198 is high or drawing the complementary data node 186 to ground if the voltage on the gate of transistor 202 is high.

Advantageously the Q and the $\overline{Q}$ outputs provide the proper timing of the signals for the T and the Tb inputs for the next stage. That is, the Q and $\overline{Q}$ outputs always go low rapidly, however they rise slowly due to the current limiting effects of the bias transistors 180 and 182. The inverters 151, 152, and 153 shown in FIG. 3 provide the proper timing for the first T flip-flop 154.

FIG. 6 is an alternative embodiment, and also the preferred embodiment, of the T flip-flops 154–166. The T flip-flop of FIG. 6 has an additional n-channel transistor between each of the transistors 198 and 200, and transistors 202 and 04. As shown in FIG. 6 an n-channel transistor 206 is placed in series with transistors 198 and 200, and another n-channel transistor 208 is placed in series with transistors 202 and 204. The gates of the transistors 206 and 208 are driven by an ENABLE signal which is generated by the shared calibrate logic 12 and passed through the bus 11. The ENABLE signal is timed virtually the same as the CAL signal and is used to ensure that the T flip-flops 154–166 do not change state during the normal operation of the mixer 10. In other words, the ENABLE signal is high during the calibration operation to enable the T flip-flops to change state during the calibration operation, but the ENABLE signal is pulled low after the calibration operation to guarantee that the T flip-flops 154–166 do not change state during normal operation of the mixer 10.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A method for compensating for the offset voltage of a plurality of operational amplifiers comprising the steps of:
    a) providing a calibrate signal from a shared calibrate circuit to couple both inputs of each of the operational amplifiers to a reference voltage;
    b) providing control signals from said shared calibrate circuit to a plurality of calibration circuits, each coupled to one of the operational amplifiers in order to inject a bias current into at least one node of each of the operational amplifiers such that the offset voltages of the operational amplifiers are changed as a result of said injected current into said at least one node; and
    c) repeating step b) for different current values injected in a stepwise manner until an output of each of the operational amplifiers changes.

2. The method set forth in claim 1 wherein the at least one node is a first node, and further including the additional step of:
    a) if the output of an operational amplifier does not change for currents injected into said first node, repeating steps b) and c) except that current is injected into a second node of said operational amplifier, wherein the offset voltage of the operational amplifiers is changed as a result of said injected current into said second node, the change in the offset voltage being in a direction complementary to the change in the offset voltage resulting from current injected into said first node.

3. The method set forth in claim 2 wherein the current injected into said first node and said second node is stepped maximum to minimum.

4. Apparatus for compensating for the offset voltage of a plurality of operational amplifiers comprising:
    a) a shared calibrate circuit having a calibrate signal output coupled to each of the operational amplifiers, each of the operational amplifiers coupling both inputs to a reference voltage in response to receiving said calibrate signal;
    b) a plurality of calibration circuits coupled to said shared calibrate circuit and to one of said plurality of operational amplifiers, each of the calibration circuits, in response to a control signal from said shared calibrate circuit, injecting a bias current into at least one node of an operational amplifier such that the offset voltages of the operational amplifiers are changed as a result of said injected current into said at least one node; and
    c) wherein the bias current injected is changed in a stepwise manner until an output of each of the operational amplifiers changes.

5. The apparatus set forth in claim 4 wherein the at least one node is a first node, and wherein if the output of an operational amplifier does not change for currents injected into said first node, the currents injected from said calibration circuits is injected into a second node of said operational amplifiers, wherein the offset voltage of the operational amplifiers is changed as a result of said injected current into said second node, the change in the offset voltage being in a direction complementary to the change in the offset voltage resulting from current injected into said first node.

6. The apparatus set forth in claim 5 wherein the current injected into said first node and said second node is stepped maximum to minimum.

7. The apparatus set forth in claim 4 wherein each of the operational amplifiers has therein a compensation capacitor which is used in the normal operation of said operational amplifiers, but which is switched out of the operational amplifier circuit during a calibration operation.

* * * * *